(12) United States Patent
Varaprasad

(10) Patent No.: US 8,450,594 B2
(45) Date of Patent: *May 28, 2013

(54) METHOD OF MAKING AN ANTIREFLECTIVE SILICA COATING, RESULTING PRODUCT AND PHOTOVOLTAIC DEVICE COMPRISING SAME

(75) Inventor: Desaraju V. Varaprasad, Ann Arbor, MI (US)

(73) Assignee: Guardian Industries Corp., Auburn Hills, MI (US)

( * ) Notice: Subject to any disclaimer, the term of this patent is extended or adjusted under 35 U.S.C. 154(b) by 1128 days.

This patent is subject to a terminal disclaimer.

(21) Appl. No.: 12/000,319

(22) Filed: Dec. 11, 2007

(65) Prior Publication Data

US 2009/0025777 A1 Jan. 29, 2009

Related U.S. Application Data

(63) Continuation-in-part of application No. 11/878,790, filed on Jul. 26, 2007.

(51) Int. Cl.
 *H02N 6/00* (2006.01)
 *H05B 6/00* (2006.01)
(52) U.S. Cl.
 USPC .......................................... 136/243; 427/595
(58) Field of Classification Search
 USPC .......................................... 136/243; 427/595
 See application file for complete search history.

(56) References Cited

U.S. PATENT DOCUMENTS

| 4,510,344 | A | 4/1985 | Berman |
| 4,792,536 | A | 12/1988 | Pecoraro et al. |
| 4,806,436 | A | 2/1989 | Tada et al. |
| 4,816,333 | A | 3/1989 | Lange et al. |
| 4,830,879 | A | 5/1989 | Debsikdar |
| 5,214,008 | A | 5/1993 | Beckwith et al. |

(Continued)

FOREIGN PATENT DOCUMENTS

| DE | 103 29 917 | 2/2005 |
| EP | 0 482 821 | 4/1992 |

(Continued)

OTHER PUBLICATIONS

Handbook of Science and Photovoltaic Engineering, 2003, John Wiley & Sons, Ltd., ISBN 0-471-49196-9, p. 62.*

(Continued)

*Primary Examiner* — Jonathan Johnson
*Assistant Examiner* — Tamir Ayad
(74) *Attorney, Agent, or Firm* — Nixon & Vanderhye P.C.

(57) ABSTRACT

A low-index silica coating may be made by forming a silica precursor having a radiation curable composition including a radiation curable monomer and/or a photoinitiator, and also including a silica sol comprising a silane and/or a colloidal silica. The silica precursor may be deposited on a substrate (e.g., glass substrate or silicon wafer) to form a coating layer. The coating layer may then be cured via exposure to electromagnetic radiation, such as UV radiation. Then, the cured coating layer may be fired using temperature(s) of from about 550 to 700° C., in forming the low-index silica based coating. The low-index silica based coating may be used as an antireflective (AR) film on a front glass substrate of a photovoltaic device (e.g., solar cell) in certain example instances.

22 Claims, 9 Drawing Sheets

U.S. PATENT DOCUMENTS

| | | | |
|---|---|---|---|
| 5,401,287 A | 3/1995 | Pecoraro et al. | |
| 5,480,722 A | 1/1996 | Tomonaga et al. | |
| 5,883,030 A | 3/1999 | Bako et al. | |
| 5,948,131 A | 9/1999 | Neuman | |
| 5,964,962 A | 10/1999 | Sannomiya et al. | |
| 5,977,477 A | 11/1999 | Shiozaki | |
| 6,372,327 B1 | 4/2002 | Burnham et al. | |
| 6,403,509 B2 | 6/2002 | Cochran et al. | |
| 6,407,021 B1 | 6/2002 | Kitayama et al. | |
| 6,495,482 B1 | 12/2002 | de Sandro et al. | |
| 6,498,118 B1 | 12/2002 | Landa et al. | |
| 6,503,860 B1 | 1/2003 | Dickinson et al. | |
| 6,506,622 B1 | 1/2003 | Shiozaki | |
| 6,521,558 B2 | 2/2003 | Landa et al. | |
| 6,573,207 B2 | 6/2003 | Landa et al. | |
| 6,576,344 B1 | 6/2003 | Doushita et al. | |
| 6,576,349 B2 | 6/2003 | Lingle et al. | |
| 6,610,622 B1 | 8/2003 | Landa et al. | |
| 6,716,780 B2 | 4/2004 | Landa et al. | |
| 6,723,211 B2 | 4/2004 | Lingle et al. | |
| 6,749,941 B2 | 6/2004 | Lingle | |
| 6,776,007 B2 | 8/2004 | Hirota et al. | |
| 6,787,005 B2 | 9/2004 | Laird et al. | |
| 6,796,146 B2 | 9/2004 | Burnham | |
| 6,846,760 B2 | 1/2005 | Siebers et al. | |
| 6,863,518 B2 * | 3/2005 | Powers | 425/145 |
| 6,887,575 B2 | 5/2005 | Neuman et al. | |
| 6,921,578 B2 * | 7/2005 | Tsujino et al. | 428/428 |
| 6,936,347 B2 | 8/2005 | Laird et al. | |
| 6,974,630 B1 | 12/2005 | Stachowiak | |
| 7,081,302 B2 | 7/2006 | Lemmer et al. | |
| 2002/0090519 A1 | 7/2002 | Kursawe et al. | |
| 2002/0122962 A1 | 9/2002 | Arfsten et al. | |
| 2004/0028918 A1 | 2/2004 | Becker et al. | |
| 2004/0058079 A1 | 3/2004 | Yamada et al. | |
| 2004/0121896 A1 | 6/2004 | Landa et al. | |
| 2004/0140001 A1 | 7/2004 | Hammerbacher et al. | |
| 2004/0209757 A1 | 10/2004 | Landa et al. | |
| 2004/0248995 A1 | 12/2004 | Glaubitt et al. | |
| 2004/0258929 A1 | 12/2004 | Glaubitt et al. | |
| 2005/0195486 A1 | 9/2005 | Sasaki et al. | |
| 2006/0019114 A1 | 1/2006 | Thies et al. | |
| 2006/0062902 A1 | 3/2006 | Sager et al. | |
| 2007/0074757 A1 | 4/2007 | Mellott et al. | |
| 2007/0116966 A1 | 5/2007 | Mellott et al. | |

FOREIGN PATENT DOCUMENTS

| | | |
|---|---|---|
| EP | 1 329 433 | 7/2003 |
| JP | 07-122764 | 5/1995 |
| JP | 11-60269 | 3/1999 |

OTHER PUBLICATIONS

International Search Report dated Jan. 28, 2009.
U.S. Appl. No. 11/878,790, filed Jul. 26, 2007.
U.S. Appl. No. 11/122,218, filed May 5, 2005.
U.S. Appl. No. 11/049,292, filed Feb. 3, 2005.
"Colored Glasses" Weyl; The Society of Glass Technology 1951, (4pgs).
"Colour Generation and Control in Glass", Bamford, Glass Science and Technology, 2, 1977 (3pgs).
"Photovoltaic Module Performance and Durability Following Long-Term Field Exposure", King et al., Sandia National Laboratories, (19pgs).
"Antireflection of Glazings for Solar Energy Applications", Nostell et al., Solar Energy Materials and Solar Cells 54 (1988) pp. 223-233.
"Anti-reflection (AR) Coatings Made by Sol-Gel Process: A Review", Chen, Solar Energy Materials and Solar Cells 68 (2001) pp. 313-336.
"Silica Antireflective Films on Glass Produced by the Sol-Gel Method", Bautista et al., Solar Energy Materials and Solar Cells 80 (2003) pp. 217-225.
U.S. Appl. No. 11/701,541, filed Feb. 2, 2007.
U.S. Appl. No. 11/790,813, filed Apr. 27, 2007.

* cited by examiner

METHOD OF MAKING AN ANTIREFLECTIVE SILICA COATING, RESULTING PRODUCT AND PHOTOVOLTAIC DEVICE COMPRISING SAME

This application is a continuation-in-part of U.S. patent application Ser. No. 11/878,790, filed Jul. 26, 2007, the entirety of which is incorporated herein by reference.

This invention relates to a method of making a low index silica coating from radiation curable precursor coatings. The coating may comprise an antireflective (AR) coating supported by a glass substrate for use in a photovoltaic device or the like in certain example embodiments. Other substrates (such as silicon wafers) and multi-layer coatings are also within the scope of various embodiments. The AR coating includes, in certain exemplary embodiments, materials having a polymerizable organic functionality such as epoxy groups, acrylate, and/or isocyanate groups that may react with photo-sensitive monomers.

BACKGROUND OF THE INVENTION

Glass is desirable for numerous properties and applications, including optical clarity and overall visual appearance. For some example applications, certain optical properties (e.g., light transmission, reflection and/or absorption) are desired to be optimized. For example, in certain example instances, reduction of light reflection from the surface of a glass substrate may be desirable for storefront windows, display cases, photovoltaic devices (e.g., solar cells), picture frames, other types of windows, and so forth.

Photovoltaic devices such as solar cells (and modules therefor) are known in the art. Glass is an integral part of most common commercial photovoltaic modules, including both crystalline and thin film types. A solar cell/module may include, for example, a photoelectric transfer film made up of one or more layers located between a pair of substrates. One or more of the substrates may be of glass, and the photoelectric transfer film (typically semiconductor) is for converting solar energy to electricity. Example solar cells are disclosed in U.S. Pat. Nos. 4,510,344, 4,806,436, 6,506,622, 5,977,477, and JP 07-122764, the disclosures of which are hereby incorporated herein by reference.

Substrate(s) in a solar cell/module are sometimes made of glass. Incoming radiation passes through the incident glass substrate of the solar cell before reaching the active layer(s) (e.g., photoelectric transfer film such as a semiconductor) of the solar cell. Radiation that is reflected by the incident glass substrate does not make its way into the active layer(s) of the solar cell, thereby resulting in a less efficient solar cell. In other words, it would be desirable to decrease the amount of radiation that is reflected by the incident substrate, thereby increasing the amount of radiation that makes its way to the active layer(s) of the solar cell. In particular, the power output of a solar cell or photovoltaic (PV) module may be dependant upon the amount of light, or number of photons, within a specific range of the solar spectrum that pass through the incident glass substrate and reach the photovoltaic semiconductor.

Because the power output of the module may depend upon the amount of light within the solar spectrum that passes through the glass and reaches the PV semiconductor, certain attempts have been made in an attempt to boost overall solar transmission through the glass used in PV modules. One attempt is the use of iron-free or "clear" glass, which may increase the amount of solar light transmission when compared to regular float glass, through absorption minimization.

In certain example embodiments of this invention, an attempt to address the aforesaid problem(s) is made using an antireflective (AR) coating on a glass substrate (the AR coating may be provided on either side of the glass substrate in different embodiments of this invention). An AR coating may increase transmission of light through the light incident substrate, and thus the power of a PV module in certain example embodiments of this invention.

Conventional wet chemical methods to produce silica coatings may employ sol-gel processes involving hydrolysis and condensation reactions of silicon alkoxides to produce stable sols. Silica precursor coatings (formed from silica sols) may be cured at elevated temperatures to convert to silicon dioxide coatings. Silica coatings formed by conventional sol-gel processes may have a refractive index of about 1.45 at 550 nm. However, an example optimum refractive index for monolayer antireflective coatings may be about 1.24. While addition of colloidal silica to silicon alkoxides in sol-gel processes may facilitate lowering a coating's refractive index, it has generally been possible to achieve a coating having a refractive index of about 1.32.

Conventional methods to produce low index silica coatings may result in porous coatings that may not be mechanically robust (and hence perhaps not suitable for practical applications). It will be appreciated that there may exist a need for a method to produce low index silica coatings having improved mechanical properties.

A silica sol may be aged for several hours after preparation in order to ensure thorough hydrolysis of precursor alkoxides. The stability of silica sol may be affected by several factors including pH, water content, concentration of solids, etc., and the resultant sol may be dynamic in nature with continuing changes to the rheological characteristics of the sol. Thus producing stable sols at manufacturing volumes can be challenging. While the shelf life of silica sols may be influenced by storage and transportation conditions, the useful pot life during processing may be affected by loss of volatiles and exposure to ambient humidity, etc. In order to produce optical quality coatings that remain crack-free during high temperature densification process wet coatings of silica sols may be carefully processed during initial heating stages. Heating profiles including gradual temperature ramp rates can be employed to promote condensation and cross-linking reactions. Thus there exists a need for a method to produce stable silica precursor formulations which remain largely unaffected by variations in temperature and humidity during storage, transportation and processing. There also exists a need for a method by which silica coatings could be formed instantly without the need for initial thermal processing prior to high temperature densification.

Thus, it will be appreciated that there may exist a need for an improved AR coating, for use in PV or other applications, to reduce reflection off of glass or other substrates.

BRIEF SUMMARY OF EXAMPLE EMBODIMENTS OF THE INVENTION

In certain example embodiments of this invention, there is provided a method of making a low-index silica coating made by forming a silica precursor having a radiation curable composition comprising a radiation curable monomer and a photoinitiator and also having a silica sol comprising a silane and/or a colloidal silica; depositing the silica precursor on a substrate to form a coating layer; curing the coating layer through exposure to electromagnetic radiation; and curing the coating layer through firing in an oven, or otherwise, at a temperature ranging from 550 to 700° C. for a duration of from about 1 to 10 minutes.

In certain exemplary embodiments of this invention, there is a photovoltaic device such as a solar cell comprising: a photovoltaic layer and at least a glass substrate on a light incident side of the photovoltaic layer; an antireflection coating provided on the glass substrate, the antireflection coating being located on a light-incident side of the glass substrate; wherein the antireflection coating is made by forming a silica precursor having a radiation curable composition comprising a radiation curable monomer and/or a photoinitiator and also having a silica sol comprising a silane and/or a colloidal silica; depositing the silica precursor on a glass substrate to form a coating layer; curing the coating layer through exposure to electromagnetic radiation; and curing the coating layer through firing at a temperature ranging from 550 to 700° C. for a duration between 1 and 10 minutes.

In certain exemplary embodiments of this invention, there is a photovoltaic device comprising: a photovoltaic film, and at least a glass substrate on a light incident side of the photovoltaic film; an antireflection coating provided on the glass substrate; wherein the antireflection coating comprises at least a layer provided directly on and contacting the glass substrate, the layer produced using a method comprising the steps of: forming a silica precursor having a radiation curable composition comprising a radiation curable monomer and a photoinitiator and also having a silica sol comprising a silane and/or a colloidal silica; depositing the silica precursor on a glass substrate to form a coating layer; curing the coating layer through exposure to electromagnetic radiation; and curing the coating layer through firing in an oven at a temperature ranging from 550 to 700° C. for a duration between 1 and 10 minutes.

DETAILED DESCRIPTION OF EXEMPLARY EMBODIMENTS OF THE INVENTION

Figure 1:
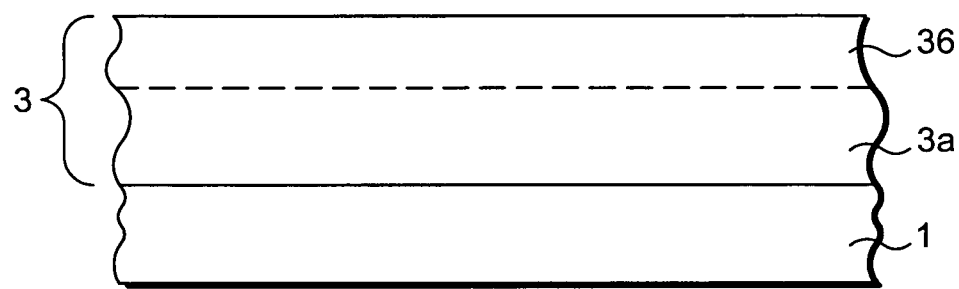
FIG. 1 is a cross sectional view of a coated article including an antireflective (AR) coating made in accordance with an example embodiment of this invention (this coated article of FIG. 1 may be used in connection with a photovoltaic device or in any other suitable application in different embodiments of this invention).

Referring now more particularly to the accompanying drawings in which like reference numerals indicate like parts throughout the several views.

This invention relates to antireflective (AR) coatings that may be provided for in coated articles used in devices such as photovoltaic devices, storefront windows, display cases, picture frames, other types of windows, and the like. In certain example embodiments (e.g., in photovoltaic devices), the AR coating may be provided on either the light incident side or the other side of a substrate (e.g., glass substrate), such as a front glass substrate of a photovoltaic device.

Although described in connection with an AR coating on a glass substrate, it should be understood that certain embodiments of the present invention relate to silica coatings for silicon wafers and other polymeric substrates (e.g., plastics, like polycarbonates and/or acrylics).

In certain example embodiments of this invention, an improved anti-reflection (AR) coating is provided on an incident glass substrate of a solar cell or the like. This AR coating may function to reduce reflection of light from the glass substrate, thereby allowing more light within the solar spectrum to pass through the incident glass substrate and reach the photovoltaic semiconductor so that the solar cell can be more efficient. In other example embodiments of this invention, such an AR coating is used in applications other than photovoltaic devices (e.g., solar cells), such as in storefront windows, display cases, picture frames, greenhouse glass/windows, solariums, other types of windows, and the like. The glass substrate may be a glass superstrate or any other type of glass substrate in different instances.

FIG. 1 is a cross sectional view of a coated article according to an example embodiment of this invention. The coated article of FIG. 1 includes a glass substrate 1 and an AR coating 3. The AR coating includes a first layer 3a and an optional overcoat layer 3b.

In the FIG. 1 embodiment, the antireflective coating 3 includes first layer 3a comprising a photomonomer and/or photopolymer. The first layer 3a may be any suitable thickness in certain example embodiments of this invention. However, in certain example embodiments, the first layer 3a of the AR coating 3 has a thickness of approximately 500 to 4000 Å after firing.

Optionally, the AR coating 3 may also include an overcoat 3b of or including a material such as silicon oxide (e.g., $SiO_2$), or the like, which may be provided over the first layer 3a in certain example embodiments of this invention as shown in FIG. 1. In certain example embodiments, the overcoat antireflective layer 3b is composed of $SiO_2$. While silicon oxide is preferred for destructive interference layer 3b in certain example embodiments, it is possible to use other materials for this layer 3b in other example embodiments of this invention. Silicon oxide inclusive layer 3b may be relatively dense in certain example embodiments of this invention; e.g., from about 75-100% hardness, for protective purposes. The overcoat layer 3b may be deposited over layer 3a in any suitable manner. For example, a Si or SiAl target could be sputtered in an oxygen and argon atmosphere to sputter-deposit the silicon oxide inclusive layer 3b. Alternatively, the silicon oxide inclusive layer 3b could be deposited by flame pyrolysis, or any other suitable technique such as spraying, roll coating, printing, via silica precursor (then drying and curing), coating with a silica dispersion of nano or colloidal particles, vapor phase deposition, and so forth. It is noted that it is possible to form other layer(s) over overcoat layer 3b in certain example instances. It is also possible to form other layer(s) between layers 3a and 3b, and/or between glass substrate 1 and layer 3a, in different example embodiments of this invention.

It is noted that layer 3a and/or 3b may be doped with other materials such as titanium, aluminum, nitrogen or the like.

In certain example embodiments of this invention, high transmission low-iron glass may be used for glass substrate 1 in order to further increase the transmission of radiation (e.g., photons) to the active layer of the solar cell or the like. For example and without limitation, the glass substrate 1 may be of any of the glasses described in any of U.S. patent application Ser. Nos. 11/049,292 and/or 11/122,218, the disclosures of which are hereby incorporated herein by reference. Furthermore, additional suitable glasses include, for example (i.e., and without limitation): standard clear glass; and/or low-iron glass, such as Guardian's ExtraClear, UltraWhite, or Solar. No matter the composition of the glass substrate, certain embodiments of anti-reflective coatings produced in accordance with the present invention may increase transmission of light to the active semiconductor film of the photovoltaic device.

Certain glasses for glass substrate 1 (which or may not be patterned in different instances) according to example embodiments of this invention utilize soda-lime-silica flat glass as their base composition/glass. In addition to base composition/glass, a colorant portion may be provided in order to achieve a glass that is fairly clear in color and/or has a high visible transmission. An exemplary soda-lime-silica base glass according to certain embodiments of this invention, on a weight percentage basis, includes the following basic ingredients: $SiO_2$, 67-75% by weight; $Na_2O$, 10-20% by weight; CaO, 5-15% by weight; MgO, 0-7% by weight; $Al_2O_3$, 0-5% by weight; $K_2O$, 0-5% by weight; $Li_2O$, 0-1.5% by weight; and BaO, 0-1%, by weight.

Other minor ingredients, including various conventional refining aids, such as $SO_3$, carbon, and the like may also be included in the base glass. In certain embodiments, for example, glass herein may be made from batch raw materials silica sand, soda ash, dolomite, limestone, with the use of sulfate salts such as salt cake ($Na_2SO_4$) and/or Epsom salt ($MgSO_4 \cdot 7H_2O$) and/or gypsum (e.g., about a 1:1 combination of any) as refining agents. In certain example embodiments, soda-lime-silica based glasses herein include by weight from about 10-15% $Na_2O$ and from about 6-12% CaO, by weight.

In addition to the base glass above, in making glass according to certain example embodiments of the instant invention the glass batch includes materials (including colorants and/or oxidizers) which cause the resulting glass to be fairly neutral in color (slightly yellow in certain example embodiments, indicated by a positive b* value) and/or have a high visible light transmission. These materials may either be present in the raw materials (e.g., small amounts of iron), or may be added to the base glass materials in the batch (e.g., cerium, erbium and/or the like). In certain example embodiments of this invention, the resulting glass has visible transmission of at least 75%, more preferably at least 80%, even more preferably of at least 85%, and most preferably of at least about 90% (Lt D65). In certain example non-limiting instances, such high transmissions may be achieved at a reference glass thickness of about 3 to 4 mm In certain embodiments of this invention, in addition to the base glass, the glass and/or glass batch comprises or consists essentially of materials as set forth in Table 1 below (in terms of weight percentage of the total glass composition):

TABLE 1

Example Additional Materials In Glass

| Ingredient | General (Wt. %) | More Preferred | Most Preferred |
|---|---|---|---|
| total iron (expressed as $Fe_2O_3$): | 0.001-0.06% | 0.005-0.04% | 0.01-0.03% |
| cerium oxide: | 0-0.30% | 0.01-0.12% | 0.01-0.07% |
| $TiO_2$ | 0-1.0% | 0.005-0.1% | 0.01-0.04% |
| Erbium oxide: | 0.05 to 0.5% | 0.1 to 0.5% | 0.1 to 0.35% |

In certain example embodiments, the total iron content of the glass is more preferably from 0.01 to 0.06%, more preferably from 0.01 to 0.04%, and most preferably from 0.01 to 0.03%. In certain example embodiments of this invention, the colorant portion is substantially free of other colorants (other than potentially trace amounts). However, it should be appreciated that amounts of other materials (e.g., refining aids, melting aids, colorants and/or impurities) may be present in the glass in certain other embodiments of this invention without taking away from the purpose(s) and/or goal(s) of the instant invention. For instance, in certain example embodiments of this invention, the glass composition is substantially free of, or free of, one, two, three, four or all of: erbium oxide, nickel oxide, cobalt oxide, neodymium oxide, chromium oxide, and selenium. The phrase "substantially free" means no more than 2 ppm and possibly as low as 0 ppm of the element or material. It is noted that while the presence of cerium oxide is preferred in many embodiments of this invention, it is not required in all embodiments and indeed is intentionally omitted in many instances. However, in certain example embodiments of this invention, small amounts of erbium oxide may be added to the glass in the colorant portion (e.g., from about 0.1 to 0.5% erbium oxide).

The total amount of iron present in the glass batch and in the resulting glass, i.e., in the colorant portion thereof, is expressed herein in terms of $Fe_2O_3$ in accordance with standard practice. This, however, does not imply that all iron is actually in the form of $Fe_2O_3$ (see discussion above in this regard). Likewise, the amount of iron in the ferrous state ($Fe^{+2}$) is reported herein as FeO, even though all ferrous state iron in the glass batch or glass may not be in the form of FeO. As mentioned above, iron in the ferrous state ($Fe^{2+}$; FeO) is a blue-green colorant, while iron in the ferric state ($Fe^{3+}$) is a yellow-green colorant; and the blue-green colorant of ferrous iron is of particular concern, since as a strong colorant it introduces significant color into the glass which can sometimes be undesirable when seeking to achieve a neutral or clear color.

It is noted that the light-incident surface of the glass substrate 1 may be flat or patterned in different example embodiments of this invention.

Figure 2:
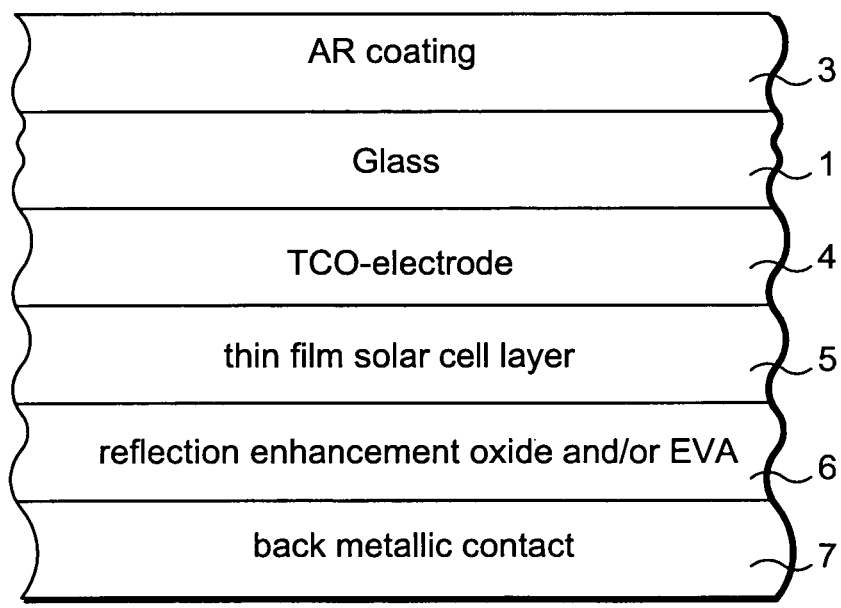
FIG. 2 is a cross sectional view of a photovoltaic device that may use the AR coating of FIG. 1.

FIG. 2 is a cross-sectional view of a photovoltaic device (e.g., solar cell), for converting light to electricity, according to an example embodiment of this invention. The solar cell of FIG. 2 uses the AR coating 3 and glass substrate 1 shown in FIG. 1 in certain example embodiments of this invention. In this example embodiment, the incoming or incident light from the sun or the like is first incident on optional layer 3b of the AR coating 3, passes therethrough and then through layer 3a and through glass substrate 1 and front transparent electrode 4 before reaching the photovoltaic semiconductor (active film) 5 of the solar cell. Note that the solar cell may also include, but does not require, a reflection enhancement oxide and/or EVA film 6, and/or a back metallic contact and/or reflector 7 as shown in example FIG. 2. Other types of photovoltaic devices may of course be used, and the FIG. 2 device is merely provided for purposes of example and understanding. As explained above, the AR coating 3 reduces reflections of the incident light and permits more light to reach the thin film semiconductor film 5 of the photovoltaic device thereby permitting the device to act more efficiently.

While certain of the AR coatings 3 discussed above are used in the context of the photovoltaic devices/modules, this invention is not so limited. AR coatings according to this invention may be used in other applications such as for picture frames, fireplace doors, and the like.

Also, other layer(s) may be provided on the glass substrate under the AR coating so that the AR coating is considered on the glass substrate even if other layers are provided therebetween. Also, while the first layer 3*a* is directly on and contacting the glass substrate 1 in the FIG. 1 embodiment, it is possible to provide other layer(s) between the glass substrate and the first layer in alternative embodiments of this invention. For example, certain embodiments of the present invention relate to the use of coatings in an arrangement of low index, high index, and/or medium index coatings. In some preferred embodiments, there is a low index coating on the light incident side of a substrate, and there is a high index coating (such as, for example, a ceria-titania-silica coating) and optionally a medium index coating between the substrate and the low index coating. The silica coatings in accordance with certain embodiments may be useful for a variety of applications, such as sodium ion barrier coatings, as a layer in multilayer AR coatings etc.

Set forth below is a description of how AR coating 3 may be made according to certain example non-limiting embodiments of this invention.

Exemplary embodiments of this invention provide a new method to produce a low index silica coating for use as the AR coating 3, with appropriate light transmission and abrasion resistance properties. Exemplary embodiments of this invention provide a method of making a coating containing a stabilized colloidal silica for use in coating 3. In certain example embodiments of this invention, the coating may be based, at least in part, on a silica sol comprising two different silica precursors, namely (a) a stabilized colloidal silica including or consisting essentially of particulate silica in a solvent and (b) a polymeric solution including or consisting essentially of silica chains.

In certain exemplary embodiments, silica precursor materials comprising a polymerizable organic functionality, such as epoxy, acrylate, and/or isocyanate groups that comprise photo sensitive monomers—may be preferred. In exemplary embodiments, materials of silica that do not contain polymerizable functionalities may also be useful.

In accordance with certain embodiments of the present invention, suitable solvents may include, for example, n-propanol, isopropanol, other well-known alcohols (e.g., ethanol), and other well-known organic solvents (e.g., toluene).

In exemplary embodiments, silica precursor materials may be combined with radiation curable organic monomeric materials and suitable catalysts or initiators to form stable silica precursor formulations. Silica precursor materials in the range from less than 1% to greater than 90% by weight may be combined with organic monomers to form coating formulations. Optionally, solvents, anti-foaming agents, surfactants, etc., may be incorporated to adjust rheological characteristics and other properties as desired. In a preferred embodiment, use of reactive diluents may be used to produce formulations containing no volatile organic matter. Some embodiments may comprise colloidal silica dispersed in monomers or organic solvents. Depending on the particular embodiment, the weight ratio of colloidal silica and other silica precursor materials may be varied. Similarly (and depending on the embodiment), the weight percentage of solids in the coating formulation may be varied.

Certain embodiments also contain silicon dioxide from a silane and/or colloidal silica. The amount of the silicon dioxide in the stable precursor coating for this formulation may preferably range from 0.1 to 10% by weight (and all subranges therebetween), more preferably 0.5% to 5% by weight (and all subranges therebetween), and even more preferably 1 to 3% by weight (and all subranges therebetween).

Because precursor materials formed by conventional wet coating techniques may be affected by exposure to radiation, curing by exposure to ultraviolet radiation (or other electromagnetic radiation) may be particularly preferred in certain embodiments of the present invention. Curing may also be caused by applying mild heat.

The term "photomonomer" (or "photo-sensitive monomer" or "radiation curable organic monomeric material") should be understood to mean a radiation curable monomer, which also include further polymerizable oligomers and polymers. Rapid curing of such a monomer may result, for example, from any stimulus that generates free radicals and ions. For example, free radical initiation can be effectively provided by a source of UV light (or other electromagnetic radiation) or electron beams. The photomonomer and/or photopolymer may basically comprise a polyester, acrylic, polyurethane or any of a number of general groups generally known to those skilled in the art. For example, the photomonomer and/or photopolymer may comprise UV-curable epoxies, UV-curable acrylates, and/or UV-curable isocyanates such as, for example, commercially available epoxies, acrylates, and/or isocyanates, including those available from Redspot, Vantec, Tangent, Dymax, Loctite, etc. In certain embodiments, the photomonomer and/or photopolymer may be Radur 401 UV clear from Van Technologies, MN, or UVB-370 supplied by Red Spot Inc., IN.

Certain embodiments may contain a photoinitiator and a UV-curable monomer (or polymer). Preferably, the weight ratio of photoinitiator in a composition comprising the photoinitiator and curable monomer ranges between 0.1 and 10% by weight (and all subranges therebetween), more preferably between 1 and 8% by weight (and all subranges therebetween), and even more preferably between 3 and 5% by weight (and all subranges therebetween).

Several examples were prepared, so as to illustrate exemplary embodiments of the present invention. Although the examples describe the use of the spin-coating method, the uncured coating may be deposited in any suitable manner, including, for example, not only by spin-coating but also roller-coating, spray-coating, and any other method of depositing the uncured coating on a substrate.

In certain exemplary embodiments, the curing may occur through exposure to primarily UV radiation preferably for 5 to 120 seconds (and all subranges therebetween), more preferably for 10 to 90 seconds (and all subranges therebetween), and even more preferably for 30 to 40 seconds (and all subranges therebetween). In certain exemplary embodiments, the firing may occur in an oven at a temperature ranging preferably from 550 to 700° C. (and all subranges therebetween), more preferably from 575 to 675° C. (and all subranges therebetween), and even more preferably from 600 to 650° C. (and all subranges therebetween). The firing may occur for a suitable length of time, such as between 1 and 10 minutes (and all subranges therebetween) or between 3 and 7 minutes (and all subranges therebetween).

In some instances, a refractive index of a coating made in accordance with an embodiment of the present invention is preferably less than 1.32 at 550 nm, more preferably less than 1.28 at 550 nm, and even more preferably less than 1.25 at 550 nm.

In accordance with exemplary embodiments, the thickness of the layer may vary. Preferably, the thickness of the coating after electromagnetic (e.g., UV) curing ranges between 1 and 10 microns (and all subranges therebetween); between 2 and 9 microns (and all subranges therebetween); and/or between 3 and 6.5 microns (and all subranges therebetween). Preferably, the thickness of the coating after firing at 625° C. for 5 minutes ranges between 500 and 4000 Å (and all subranges therebetween); between 1400 and 2600 Å (and all subranges therebetween); and/or between 1700 and 1900 Å (and all subranges therebetween). In other embodiments, the thickness of the coating after firing may be larger, such as about or 4500 Å or 6500 Å or even larger. In yet other embodiments, the thickness of the coating after firing may be lower, such as about 300 Å or smaller.

EXAMPLE #1

A mixture of UV curable epoxy monomer Cyracure resin UVR-6107 (available from Dow Chemical Co.), and a cationic photoinitiator Cyracure UVI-6992 was prepared by combining 96 gm of resin with 4 gm of initiator. To 15.65 gm of this mixture was added 0.5 gm of (3-glycidoxypropyl) trimethoxysilane (GLYMO), and 0.7 gm of 70% dispersion colloidal silica in methylethyl ketone obtained from Nissan Chemical Co. (MEK-ST) was added to form a stable silica precursor formulation. Concentration expressed in terms of total silicon dioxide for this formulation is about 2% by weight. The resulting viscous formulation is particularly suitable for roller coating process to produce coatings on large substrates. This coating formulation was applied within minutes after preparation to soda lime glass substrates by spin coating method to produce coatings of varying thickness. Coatings were cured at room temperature by exposure to UV radiation for about 30-40 seconds, and then fired at 625° C. for 5 minutes to form silica coatings of varying thickness as shown in Table 2 below.

TABLE 2

Coating thicknesses of three coatings made in accordance with Example #1

| Coating No. | RPM/30 sec | Thickness after UV curing (microns) | Thickness after firing at 625° C. for 5 minutes (Angstroms) |
|---|---|---|---|
| 1 | 2000 | 8.9 | 3550 |
| 2 | 3000 | 6.42 | 2550 |
| 3 | 4000 | 4.96 | 1890 |

EXAMPLE #2

Figure 3:
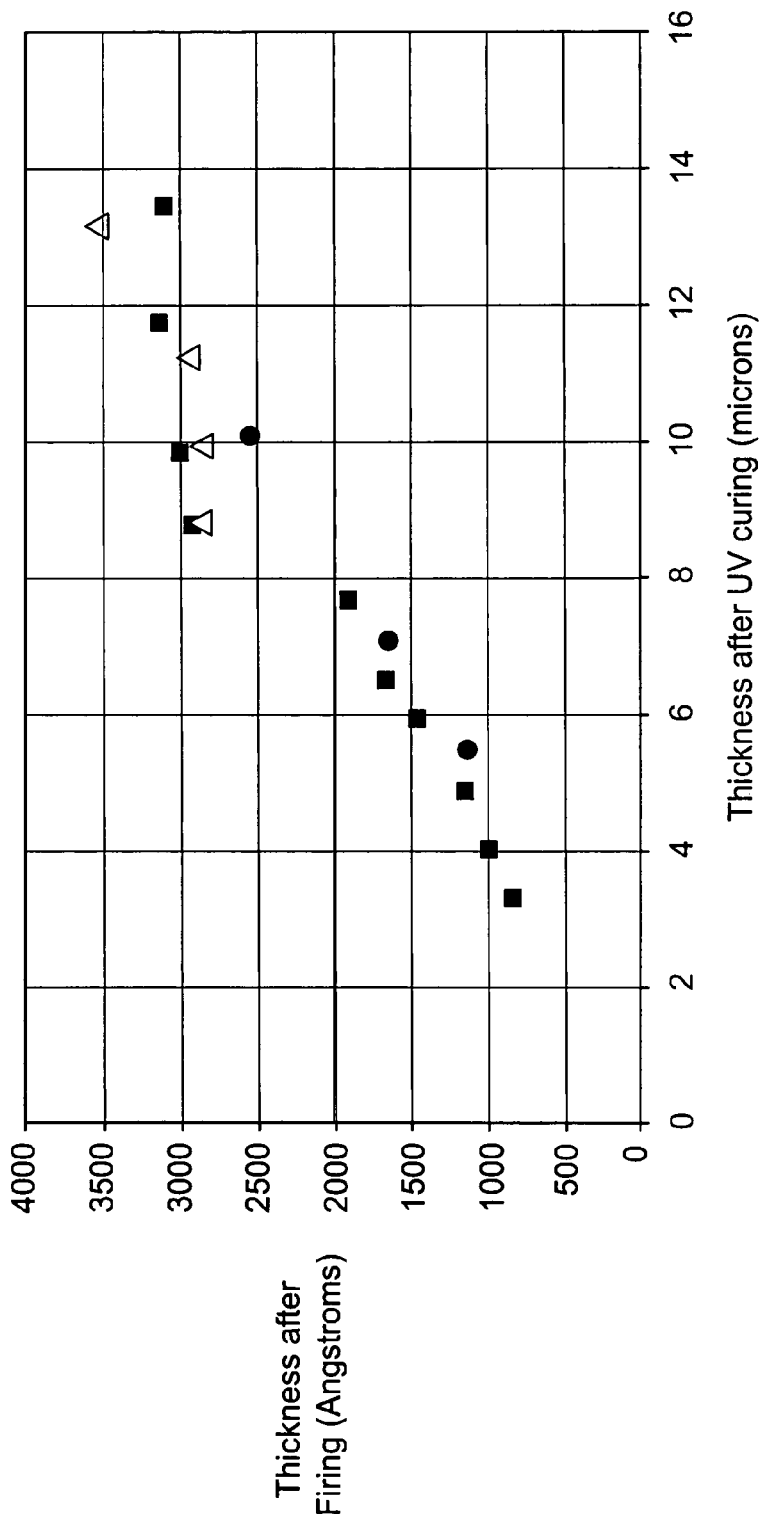
FIG. 3 shows silica coating thicknesses of coatings made in accordance with example embodiments of the present invention.
Figure 4:
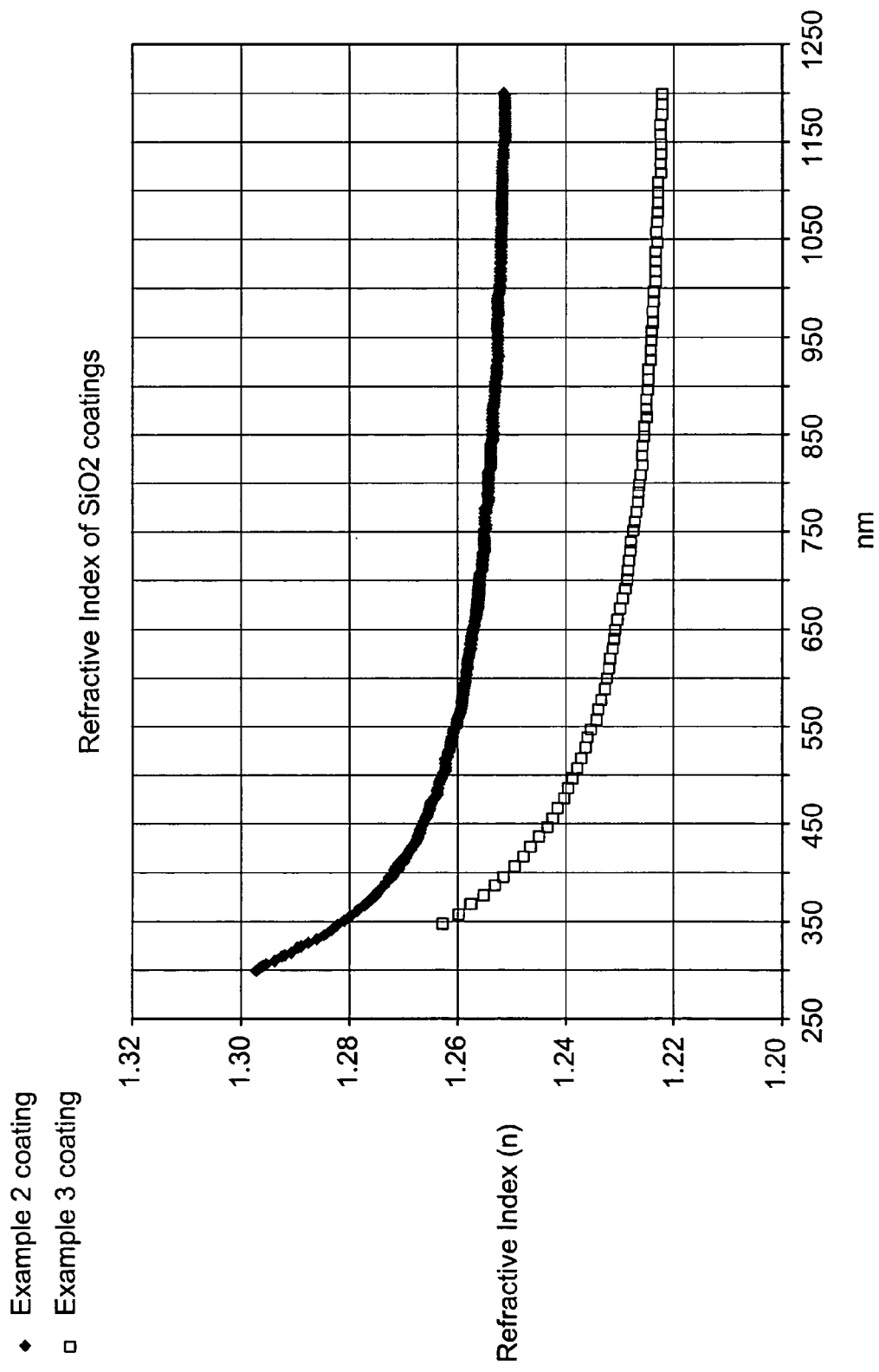
FIG. 4 shows the refractive indices of coatings made in accordance with example embodiments of this invention.
Figure 5:
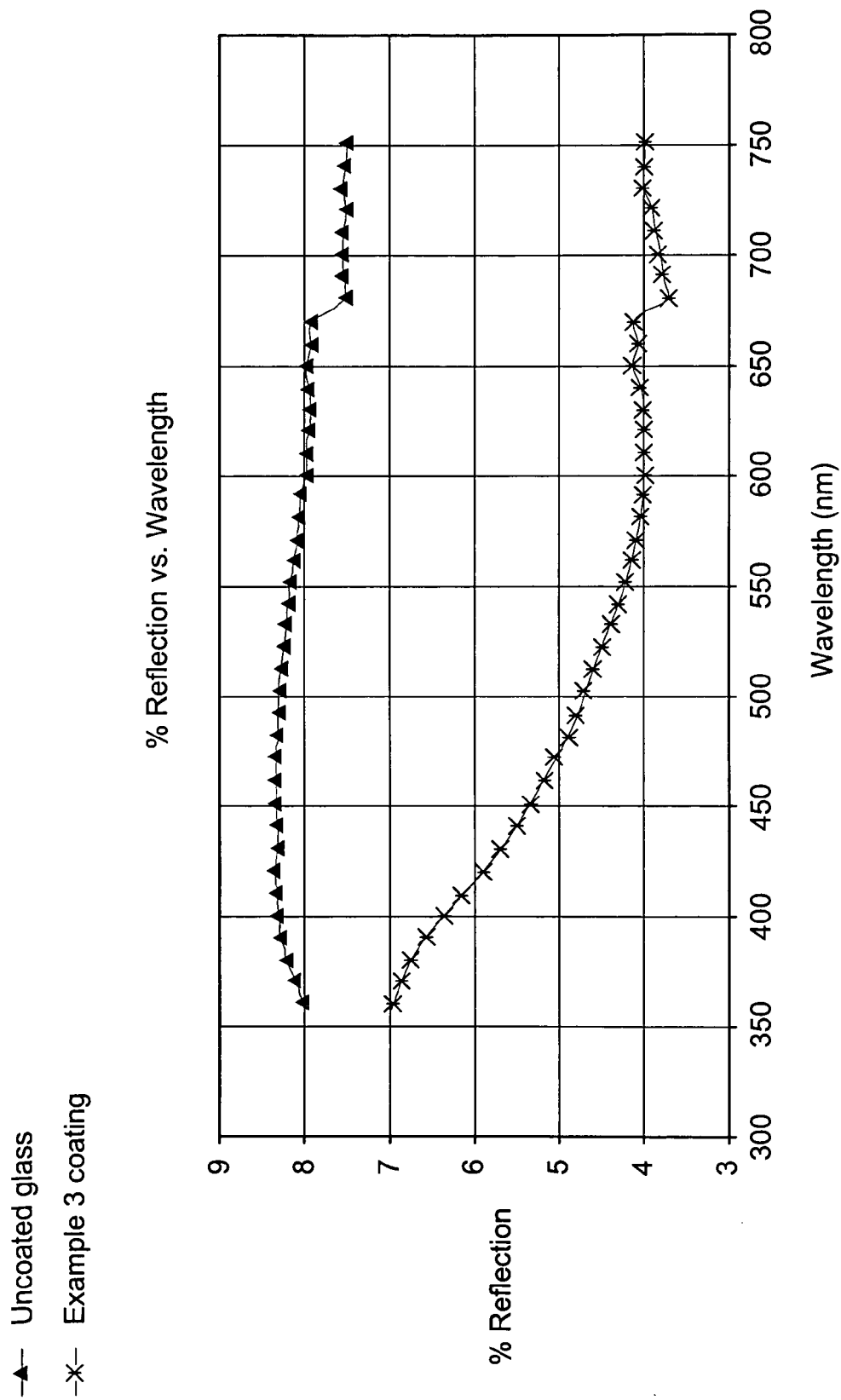
FIG. 5 shows percentage of light reflection of a coating made in accordance with an example embodiment of this invention.
Figure 6:
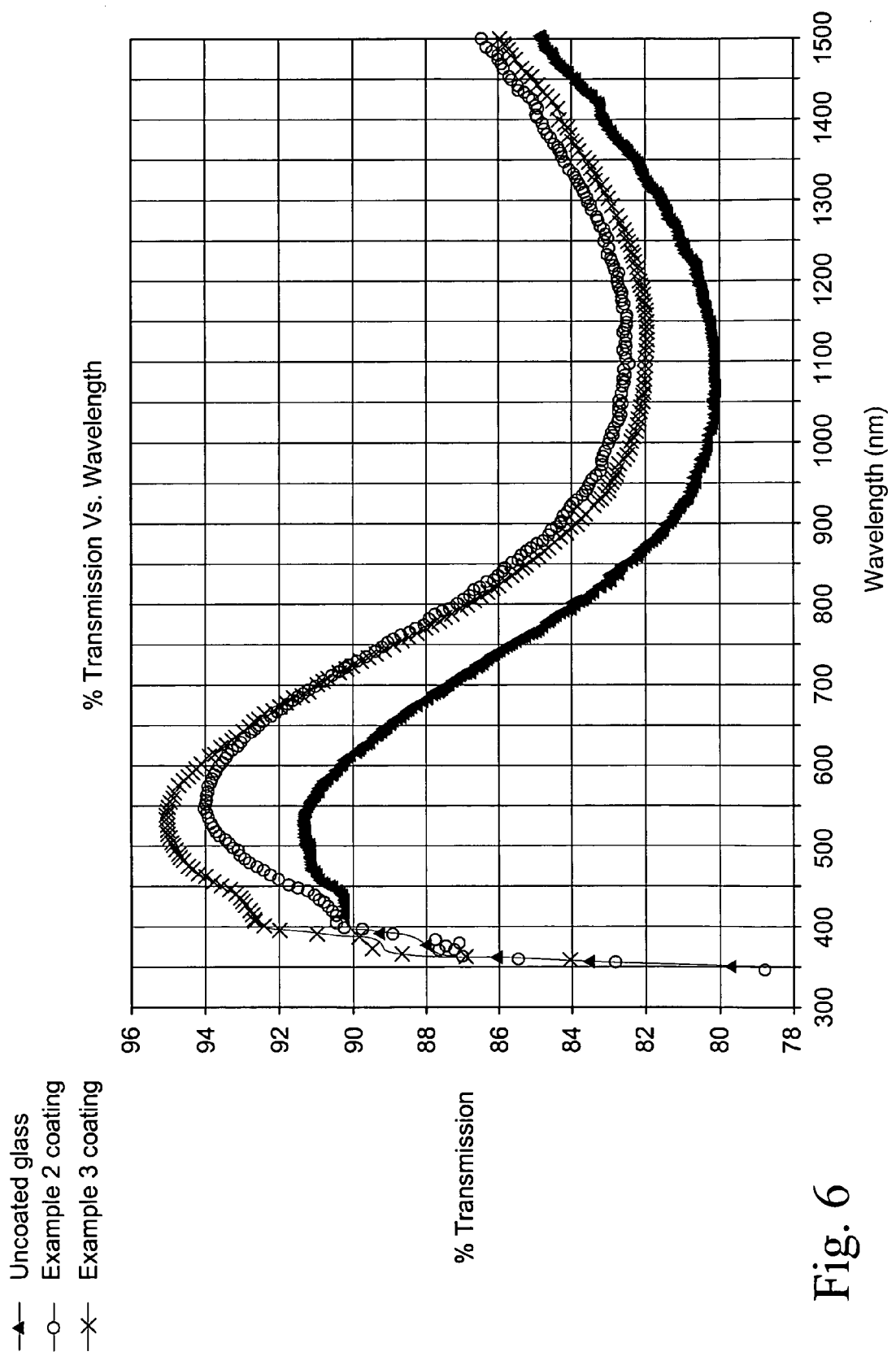
FIG. 6 shows percentage of light transmission of coatings made in accordance with example embodiments of this invention.

A coating formulation was prepared by mixing 6.6 gm of the mixture described in Example 1 and 4.5 gm of UV curable monomer described in Example 1. Coatings were made by spin coating at different RPM. Coating thickness after UV curing and after firing at 625° C./5 min is shown in FIG. 3. Refractive index of the coating No. 3 was measured to be 1.26 at 550 nm and the data is shown in FIG. 4. The reflection and transmission spectra of coating No. 3 are shown in FIGS. 5 and 6.

EXAMPLE #3

A coating formulation was prepared by combining 2.35 gm of UV curable monomer described in Example 1 with 0.13 gm of GLYMO and 0.37 gm of 15% dispersion of a colloidal silica in isopropanol, IPA-ST-UP, obtained from Nissan Chemical Co. The mixture was diluted by adding 1.57 gm of n-propanol. Coatings were made by spin coating followed by UV curing and firing as described in Example 1. Coating thickness after UV curing and after firing at 625° C./5 min is shown in Table 3. Refractive index of the coating was measured to be 1.24 at 550 nm and the data is shown in FIG. 4. The reflection and transmission spectra of coating No. 3 are shown in FIGS. 5 and 6.

TABLE 3

Coating thicknesses of four coatings made in accordance with Example #3

| Coating No. | RPM/30 sec | Thickness after UV curing (microns) | Thickness after firing at 625° C. for 5 minutes (Angstroms) |
|---|---|---|---|
| 1 | 1000 | 3.67 | 2027 |
| 2 | 1500 | 2.92 | 1740 |
| 3 | 2000 | 2.51 | 1400 |
| 4 | 3000 | 1.99 | 950 |

EXAMPLE #4

A coating formulation was prepared by combining 8.88 gm of UV curable monomer described in Example 1 with 0.2 gm of GLYMO and 0.83 gm of 15% dispersion of a colloidal silica in isopropanol, IPA-ST-UP, obtained from Nissan Chemical Co. Coatings were made by spin coating followed by UV curing and firing as described in Example 1. Coating thickness after UV curing and after firing at 625° C./5 min is shown in FIG. 3.

EXAMPLE #5

To the coating formulation described in Example 4 was added 0.05% of Troysol-AFL (available from Troy Chemie GmbH), an anti-foaming additive, and the resulting formulation was coated on sodalime glass substrates as described in Example 1. Coating thickness after UV curing and after firing at 625° C./5 min is shown in FIG. 3.

EXAMPLE #6

Figure 7:
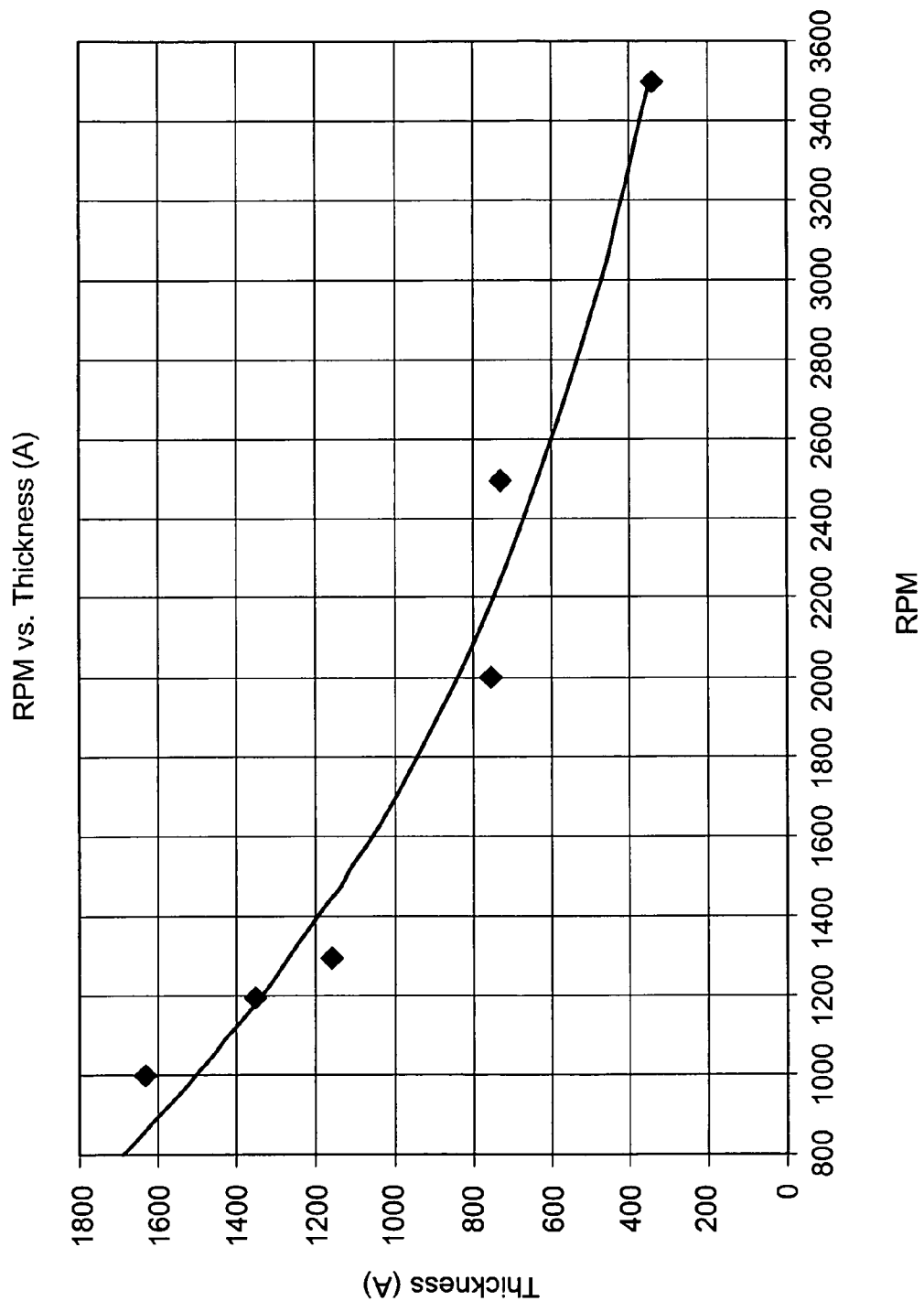
FIG. 7 illustrates silica coating thicknesses of coatings made in accordance with example embodiments of the present invention.

A mixture of UV curable epoxy monomer Cyracure resin UVR-6107, and a cationic photoinitiator Cyracure UVI-6992 is prepared by combining 96 gm or resin with 4 gm of initiator. To 95 gm of this mixture was added 5 gm of (3-glycidoxypropyl)trimethoxysilane to form a stable silica precursor formulation. Concentration expressed in terms of silicon dioxide for this formulation is about 1.27% by weight. The resulting viscous formulation is particularly suitable for roller coating process to produce coatings on large substrates. This coating formulation was applied within minutes after preparation to soda lime glass substrates and to silicon wafer by spin coating method to produce coatings of varying thickness. Coatings were cured at room temperature by exposure to UV radiation for about 30-40 seconds, and then fired at 625° C. for 5 minutes to form silica coatings of varying thickness as shown in FIG. 7.

EXAMPLE #7

Figure 8:
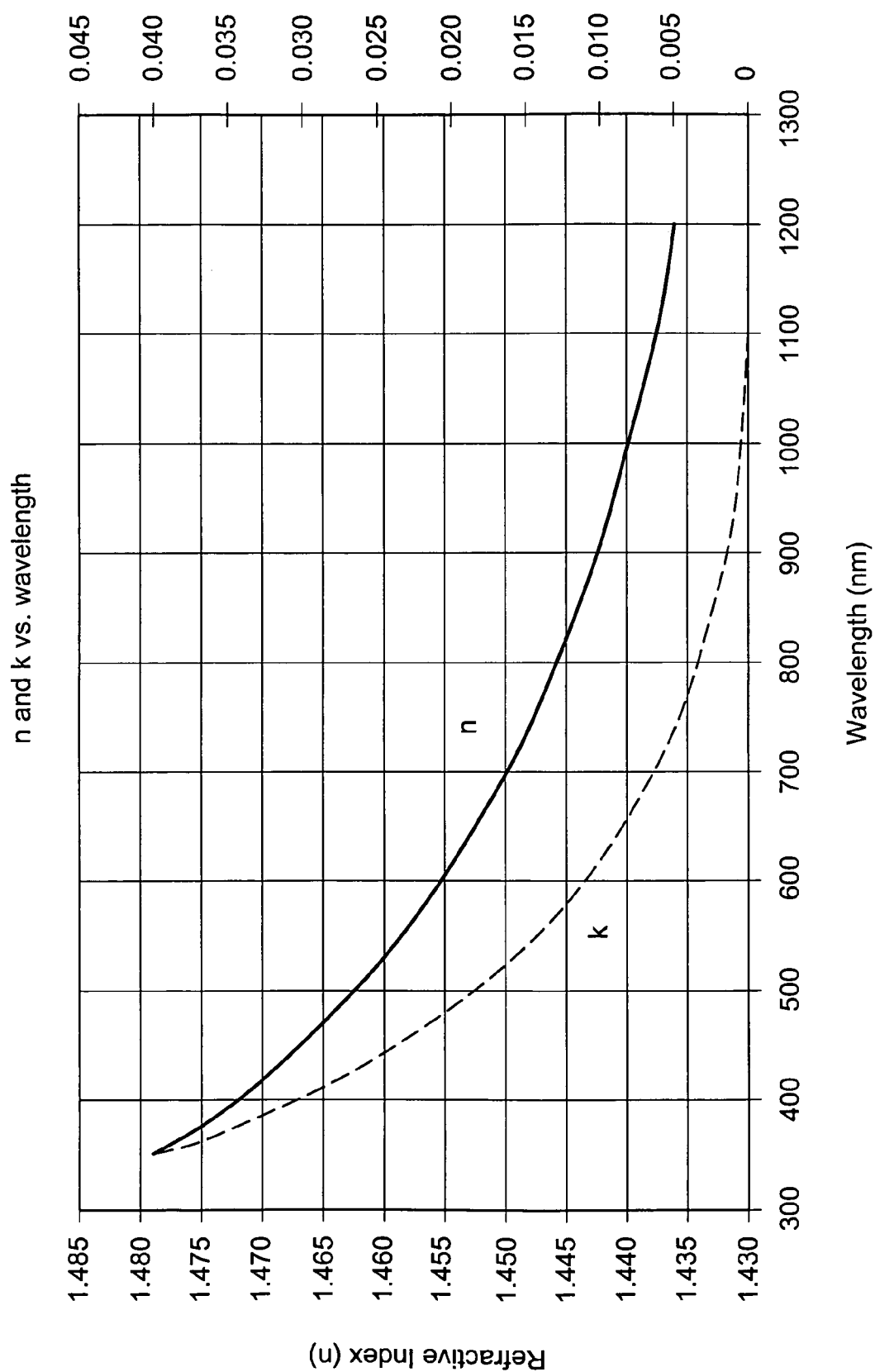
FIG. 8 illustrates refractive indices and absorption coefficients of coatings made in accordance with example embodiments of the present invention.

The coating formulation described in Example 6 was applied at 1200 rpm on a silicon wafer and processed as described to form a silica coating. The optical characteristics of the resultant coating were characterized using an ellipsometer and the data is shown in FIG. 8. The refractive index of the coating was measured to be 1.46 at 550 nm.

EXAMPLE #8

To 5 gm of the mixture of resin and photoinitator described in Example 6 was added 0.3 gm of (3-glycidoxypropyl)trimethoxysilane and 1 gm of Nissan Chemicals colloidal silica sol MEK-ST containing 30% silica by weight dispersed in methylethyl ketone. Concentration expressed in terms of total silicon dioxide for this formulation is about 6% by weight. The resulting viscous formulation was immediately spin coated on two glass substrates at 3500 rpm for 30 seconds and at 2200 rpm for 30 seconds. Coatings were cured at room temperature by exposure to UV radiation for about 30-40 seconds, and then fired at 625° C. for 5 minutes to form silica coatings of varying thickness. At lower RPM the coating thickness was about 6500 Å and at higher RPM it was 4500 and the coatings remained cracked free.

EXAMPLE #9

To 5 gm of the mixture of resin and photoinitator described in Example 6 was added 0.25 gm of (3-glycidoxypropyl) trimethoxysilane and 0.83 gm of Nyacol's colloidal silica sol DP5820 containing 30% silica by weight dispersed in the reactive diluent ethylene glycol. Concentration expressed in terms of total silicon dioxide for this formulation is about 5.1% by weight. The resulting viscous and cloudy formulation was immediately spin coated on two glass substrates at 3500 rpm for 30 seconds and at 2200 rpm for 30 seconds. Coatings were cured at room temperature by exposure to UV radiation for about 30-40 seconds, and then fired at 625° C. for 5 minutes to form silica coatings having rough surface which exhibited glare reduction properties by scattering incident light.

EXAMPLE #10

Figure 9:
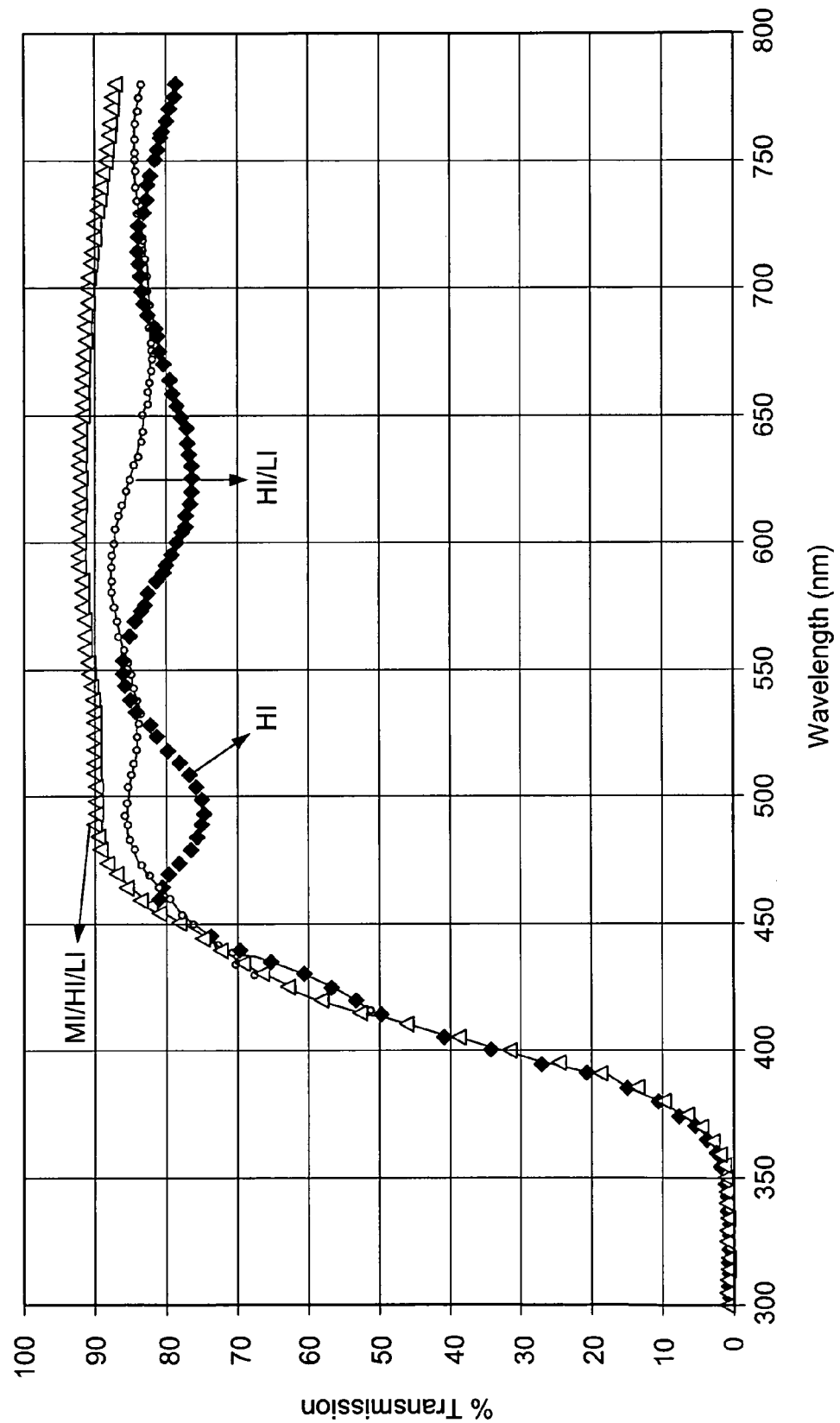
FIG. 9 illustrates percentage transmissions of coatings made in accordance with example embodiments of the present invention.
Figure 10:
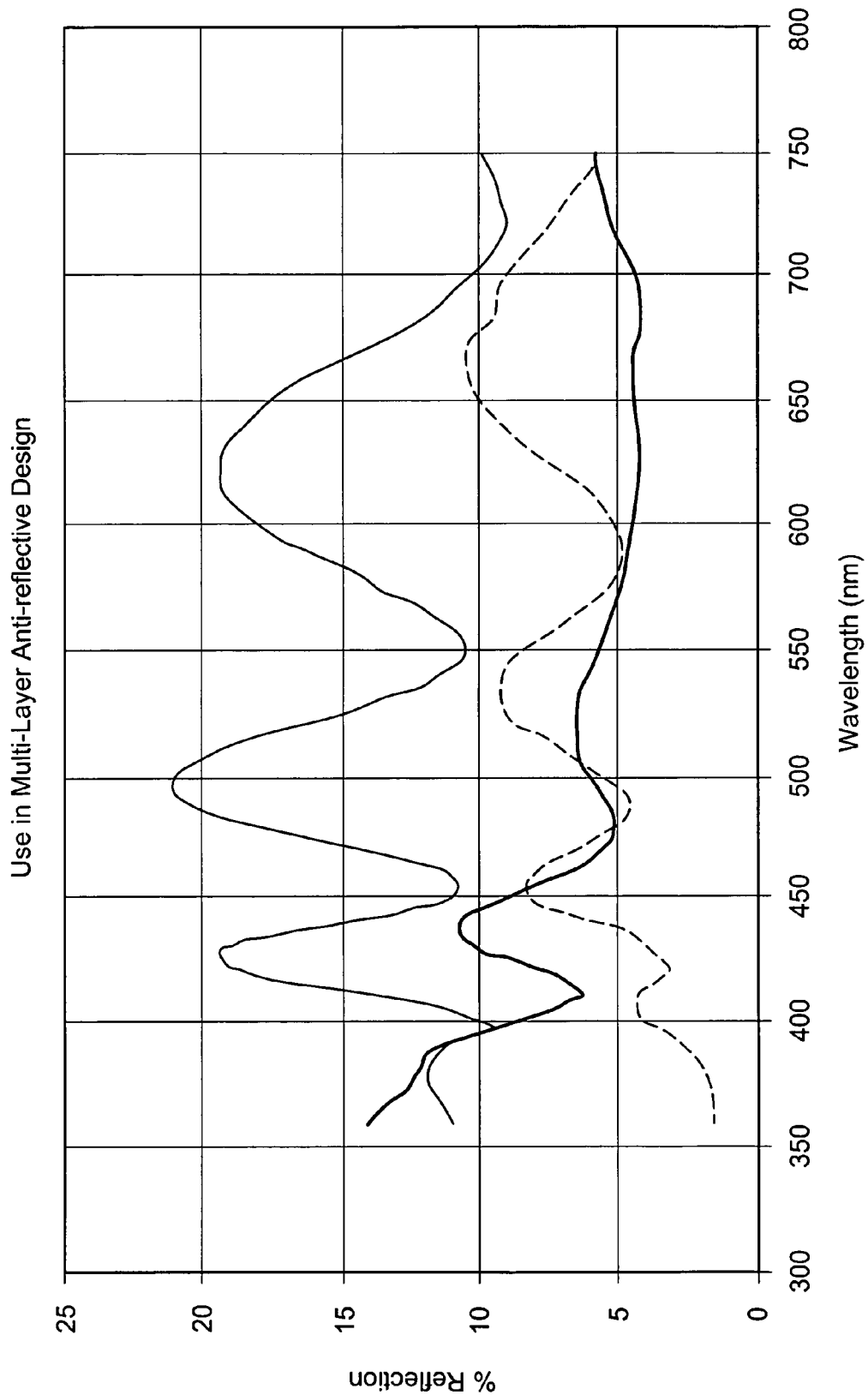
FIG. 10 illustrates percentage reflections of coatings made in accordance with example embodiments of the present invention.

The UV curable Cyracure resin UVR-6107 was mixed with cationic photoinitiator Cyracure UVI-6976 in 96/4 weight ratio. To 10 gm of this mixture was added 0.25 gm of (3-glycidoxypropyl)trimethoxysilane to form a stable coating silica precursor formulation. This coating formulation was applied as low index (LI) top coat over a high index (HI) coating comprising ceria-titania-silica deposited over ordinary soda lime glass substrate with and without a sputtered medium index (MI) coating of $SiO_xN_y$. Top coating was applied by spin coating method and cured at room temperature by exposure to UV radiation followed by firing at 650° C. for 5 minutes. Optical characteristics of the resultant anti reflective coating are shown in FIGS. 9 and 10. In FIGS. 9 and 10, the embodiment containing a low index top coat over a high index coating and a medium index coating is designated as "MI/HI/ LI." While the film side reflection decreased significantly, the transmittance of coating stack in the visible range (% Tvis) enhanced when coating in accordance with an embodiment of the present invention was used as the top coat.

All described and claimed numerical values and ranges are approximate and include at least some degree of variation.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

The invention claimed is:

1. A method of making a low-index silica based coating, the method comprising:
   forming a silica precursor comprising (a) a radiation curable composition comprising a radiation curable monomer and a photoinitiator, and (b) a silica sol comprising a silane and/or a colloidal silica;
   depositing the silica precursor on a substrate to form a coating layer, such that the coating layer is directly over and in contact with the substrate;
   curing the coating layer using at least exposure to electromagnetic radiation; and
   after said curing, firing the coating layer in an oven at a temperature of from about 550 to 700° C. for a duration of from about 1 to 10 minutes, to form the low-index silica based coating, wherein the low-index coating has a refractive index less than 1.32 at 550nm.

2. The method of claim 1, wherein the step of depositing comprises spin-coating, roller-coating, or spray-coating.

3. The method of claim 1, wherein said curing comprises exposing the coating layer to ultraviolet (UV) radiation for curing.

4. The method of claim 3, wherein said curing comprises exposing the coating layer to UV radiation for from about 5 to 120 seconds.

5. The method of claim 1, wherein the silica sol does comprises a silane which comprises (3-glycidoxypropyl)trimethoxysilane.

6. The method of claim 1, wherein the silica precursor further comprises an antifoaming additive.

7. The method of claim 1, wherein the silica precursor further comprises a solvent comprising an alcohol.

8. The method of claim 1, wherein a weight percentage of the photoinitiator in the radiation curable composition ranges between 0.1 and 10% by weight.

9. The method of claim 1, wherein a weight percentage of silicon dioxide in the silica precursor ranges between from 0.1 to 10% by weight of the silica precursor.

10. The method of claim 1, wherein the radiation curable composition comprises a UV-curable epoxy, a UV-curable acrylate, and/or a UV-curable isocyanate.

11. The method of claim 1, wherein the low-index coating has a thickness between 500 and 4000 Å after firing in the oven.

12. The method of claim 1, wherein the low-index coating has a refractive index less than 1.28 at 550nm.

13. The method of claim 1, wherein the low-index coating has a refractive index less than 1.25 at 550nm.

14. The method of claim 1, wherein the substrate comprises glass.

15. The method of claim 1, wherein the substrate comprises a silicon wafer.

16. The method of claim 14, further comprising the step of depositing a high index coating on the substrate prior to the step of depositing the silica precursor on the substrate.

17. A photovoltaic device comprising a photoelectric transfer film and the low-index coating made according to claim 16, wherein the low-index coating is provided on a light incident side of a front glass substrate of the photovoltaic device.

18. A method of making a photovoltaic device including a low-index silica based coating used in an antireflective coating, the method comprising:

depositing a high index coating on a glass substrate;

depositing a medium index coating over the high index coating, the medium index coating having an index of refraction that is lower than that of the high index coating, and higher than that of a low index coating;

forming a silica precursor comprising (a) a radiation curable composition comprising a radiation curable monomer, and (b) a silica sol comprising a silane and/or a colloidal silica;

depositing the silica precursor on the medium index coating to form the low index coating, wherein the high index coating, medium index coating, and low index coating form a coating layer;

curing the coating layer using at least exposure to electromagnetic radiation;

after said curing, firing the coating layer using elevated temperature(s) of from about 550 to 700° C. to form the low-index silica based coating; and using the glass substrate with the low-index silica based coating thereon as a front glass substrate of the photovoltaic device so that the low-index silica based coating is provided on a light incident side of the glass substrate.

19. The method of claim 18, wherein the step of depositing comprises spin-coating, roller-coating, or spray-coating.

20. The method of claim 18, wherein said curing comprises exposing the coating layer to ultraviolet (UV) radiation for curing.

21. The method of claim 20, wherein said curing comprises exposing the coating layer to UV radiation for from about 5 to 120 seconds.

22. A photovoltaic device comprising:

a photovoltaic film, and at least a glass substrate on a light incident side of the photovoltaic film;

an antireflection coating provided on the glass substrate;

wherein the antireflection coating comprises at least a layer provided on the glass substrate, the layer comprising a high index coating; and a coating layer over the high index coating, the coating layer produced using a method comprising the steps of: forming a silica precursor comprising (a) a radiation curable composition comprising a radiation curable monomer and a photoinitiator and (b) a silica sol comprising a silane and/or a colloidal silica; depositing the silica precursor on a glass substrate to form the coating layer; curing the coating layer through exposure to electromagnetic radiation; and firing the coating layer in an oven at a temperature ranging from 550 to 700° C. for a duration between 1 and 10 minutes.

* * * * *